United States Patent [19]

Harari

[11] 4,316,264

[45] Feb. 16, 1982

[54] UNIQUELY ACCESSED RAM

[76] Inventor: Eliyahou Harari, 2320 Friars La., Los Altos, Calif. 94022

[21] Appl. No.: 110,405

[22] Filed: Jan. 8, 1980

[51] Int. Cl.³ .......................... G11C 7/00; G11C 8/00
[52] U.S. Cl. ..................................... 365/190; 365/154
[58] Field of Search ........................ 365/154, 190, 222

[56] References Cited

U.S. PATENT DOCUMENTS

| | | | |
|---|---|---|---|
| 3,550,097 | 12/1970 | Reed | 365/190 |
| 4,035,782 | 7/1977 | Goser | 365/190 |
| 4,134,150 | 1/1979 | Shiga | 365/154 |
| 4,134,151 | 1/1979 | O'Connell et al. | 364/154 |
| 4,209,851 | 6/1980 | Ponder | 365/190 |

FOREIGN PATENT DOCUMENTS 1322990 7/1973 United Kingdom.

OTHER PUBLICATIONS

Wiedmann, "High-Density Static Bipolar Memory", 1973 IEEE International Solid-State Circuits Conference Digest of Tech. Papers, 2/14/73, pp. 56–57.
Spampinato et al, "High-Speed Complementary Memory Cell", IBM Tech. Disc. Bul., vol. 14, No. 6, 11/71, pp. 1723–1725.

*Primary Examiner*—Stuart N. Hecker
*Attorney, Agent, or Firm*—Skjerven, Morrill, Jensen, MacPherson & Drucker

[57] ABSTRACT

Each bistable cell of a memory matrix is uniquely accessed through a row transistor and a column transistor connected in series between one node of the bistable cell and the data-in. During WRITE, a single row is accessed activating all of the gates on the row transistors of that row, and a single column is accessed activating all of the gates on the column transistors of that column. Only the addressed cell at the intersection of the accessed row and column has both the row and column transistors turned on establishing a conductive path to the data line. All of the remaining cells on the accessed row and column have only one of their access transistors turned on. The other access transistor of these partially accessed cells remains non-conductive. The data-in on the data line is either high ("1") or low ("0") driving the addressed cell into one of two storage states. During READ only the addressed cell at the intersection of the accessed row and column has a conductive path to the high read voltage on the data line. The storage state of the addressed cell causes the data line voltage to either load down or to remain high. Write and read disturb are prevented because all of the remaining cells have at least one of their two access transistors turned off. The write and read isolation reduces the cell stability requirement to a very small trickle current necessary to maintain the node capacitance in the cell. The charge on these capacitances may be replenished periodically by charge pumping the load device. Read disturb of the accessed cell is avoided by employing a regenerative sense amplifier which restores the accessed data after each read cycle.

20 Claims, 9 Drawing Figures

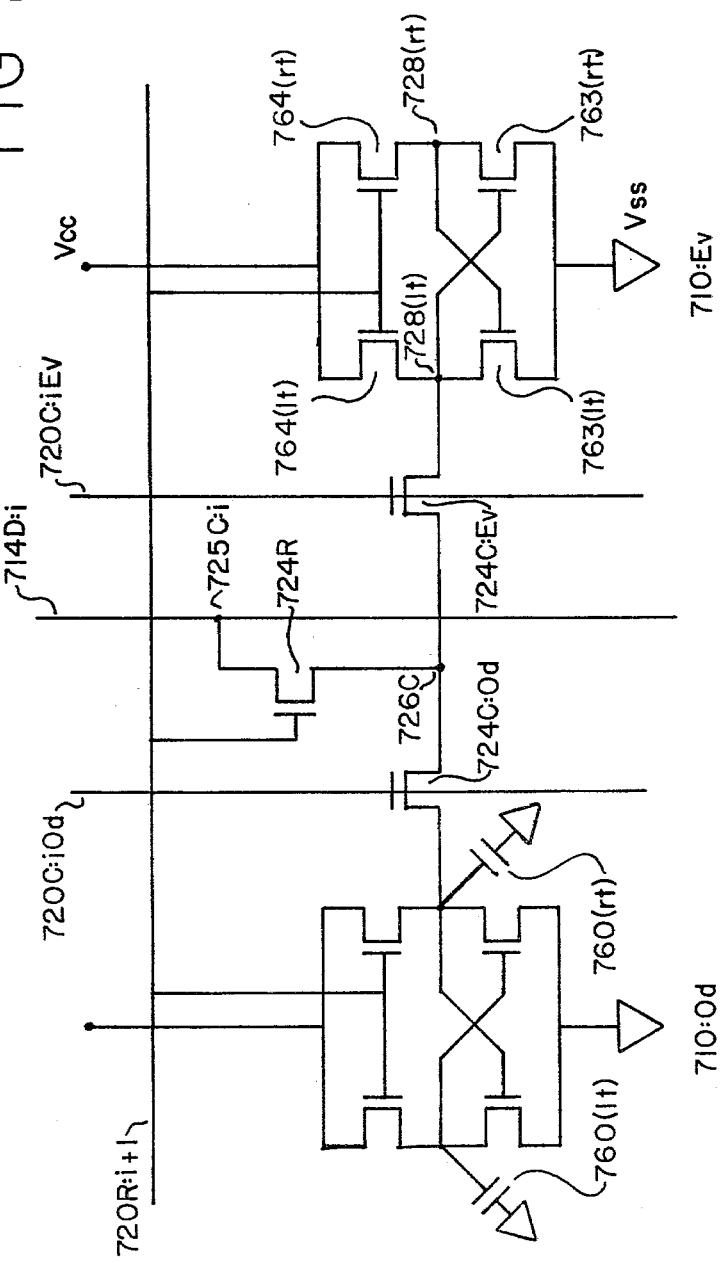

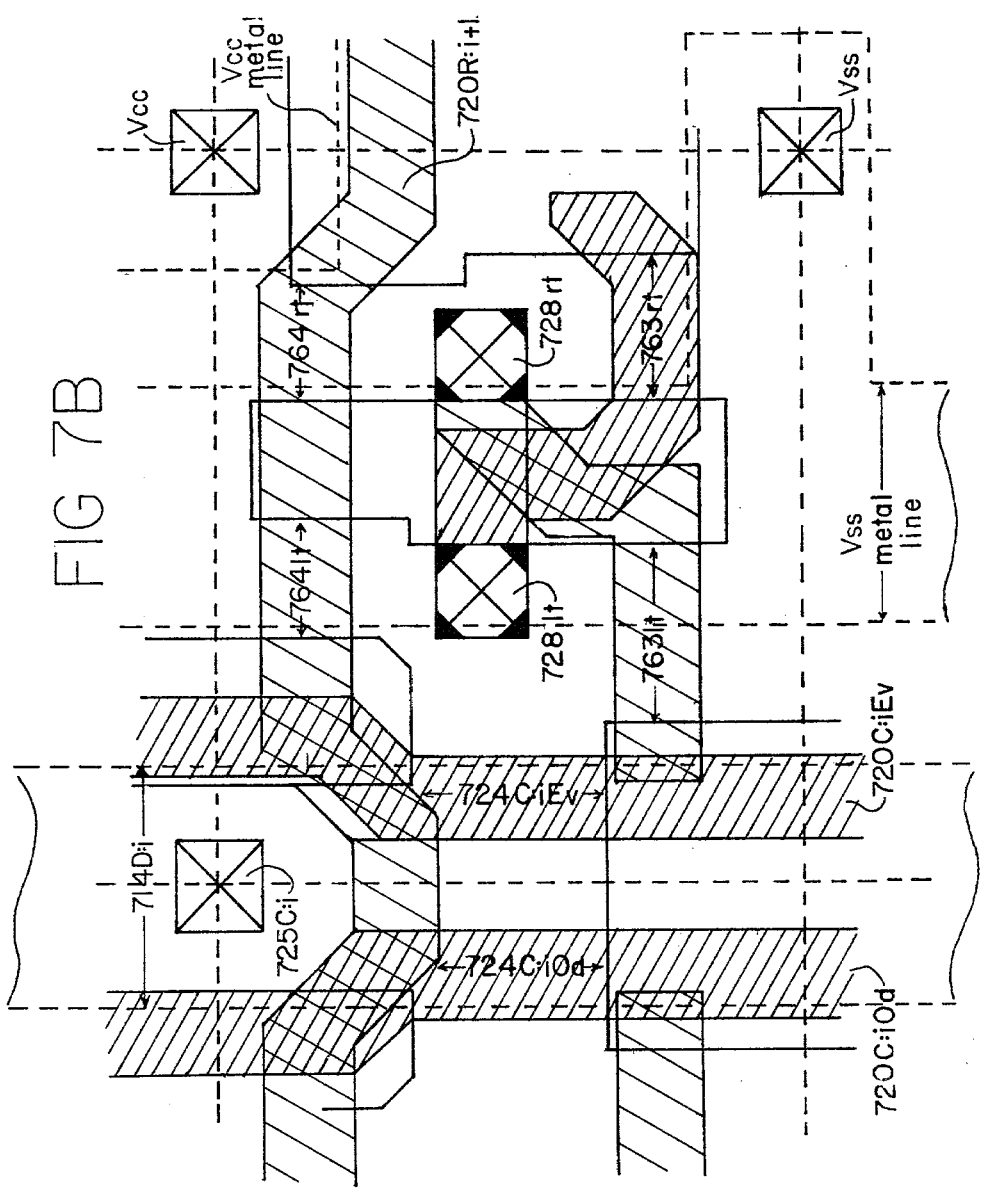

UNIQUELY ACCESSED RAM

TECHNICAL FIELD

This invention relates to a regenerative memory device in which each memory cell is uniquely accessed by row and column, and more particularly to such a memory device which has a high immunity, high density, and low power.

BACKGROUND

FIG. 1 shows a conventional six element flipflop (pushpull) type static memory 100 having an NxM matrix of memory cells such as cell 110:i arranged in N rows 1,2,3 ... (i-1),i,(i plus 1)... N and M columns 1,2,3 ... (i-1),i, (i plus 1) ... M.

In order to write into memory 100 at cell 110:i, column decoder 112 selects the i-th column via decoder transistors 113(lt):i and 113(rt):i, and applies data-in of the form D (a high voltage) and D(bar) (a low voltage) simultaneously to all of the cells in the i-th column via data lines 114D. As shown in FIG. 1, D is applied to the left side of the i-th column cells through data line 114D(lt), and D(bar) is applied to the right side of the i-th column cells through data line 114D(rt). The i-th row is then selected by row decoder 118 which applies a high access voltage to all of the cells in the i-th row via row lead 120R:i. The write access voltage activates gate 122 of each row access transistor 124(lt) and 124(rt) along the i-th row, exposing cell nodes 128 (lt) and 128(rt) therein to the data lines 114D(lt) and 114D(rt). Only cell 110:i at the intersection of the i-th row and i-th column receives both the write access voltage and the pair of data-in voltages.

Addressed cell 110:i is driven into one of two stable storage states by the D and D(bar) voltages. Either storage transistor 132(rt) conducts and 132(lt) is turned off representing a stored binary "0" (as shown in FIG. 1) or storage transistor 132(rt) is off and 132(lt) is conducting representing a stored binary "1".

After the write cycle, the desired state is maintained in cell 210:i by a trickle standby current (about one microamp) from Vcc through load resistor 136 to ground. High impedance, high density polysilicon load resistors have been employed to reduce the standby current. However, polysilicon resistors exhibit large flucuations in resistance due to manufacturing tolerence requirements, and result in lower yields.

In order to read the data stored at cell 110:i, a high read voltage is applied to both the left and right sides of every cell of memory 100 via sense amplifier 112 and data lines 114D(lt) and 114D(rt). After the data line transients have settled, a high access voltage is applied to gates 122 of each access transistor 124(lt) and 124(rt) of the i-th row. Each cell of the i-th row provides a low impedance path from either the left data line or the right data line to ground through the conducting branch of the cell. Read current 140 through each low impedance path causes the read voltage on that side of the cell to drop. The read voltage on the non-conducting side of each cell remains high.

The voltage difference between the data leads 114D(lt) and 114D(rt) of selected column "i" is sensed by sense amplifier 112. The binary "0" stored in cell 110:i causes a low read voltage on data line 114D(rt) (due to the read current 140:i flowing from data line 114(rt) through access transistor 132(rt) to ground. Sense amplifier 142 responds to the left-high, right-low status of the i-th column by processing a "0" out of memory 100.

The read current through each cell on the accessed row, whether monitored or unmonitored, is about 100 microamps. The total read current in a 16K embodiment of memory 100 (128 rows by 128 columns) is therefore about 12.8 milliamps, which presents heating problems and related cell density limitations.

In addition to excessive read currents, conventional static memory 100 of FIG. 1 also has a high read capacitance which must be charged by the read voltage on data lines 114D prior to the application of the access voltage on row lead 120R:i. The primary element of the read capacitance is between data lines 114D and ground (Cap-D), which consumes about 30% of the read cycle time for precharging. If cell 110:i is row accessed before the data line transients have settled, sense amplifier 142 may compare the two initial transient voltages on data lines 114D(lt) and 114D(rt) and process erroneous data. Static prior art memories rely on the steady state voltage difference between the left and right lines, and can not be prematurely accessed during the transient period associated with Cap-D.

Memory cells 110 must be highly stable for preventing write disturb (the arbitary flipping of the bistable addressed cell or partially addressed cells in the addressed row by the access voltages). The cells therefore require the application of both D and D(bar) voltages in order to change storage states. Cell stability is also relied on to prevent read disturb (the arbitary flipping due to the high read voltage). During both write and read, each cell 110 along the i-th row is fully accessed by the high voltage on row lead 120R:i, and easily susceptible to flipping.

Two conventional techniques are employed to prevent write and read disturb. First the cells 110 are designed as stable as possible, ie. the cells have large storage transistors 132 in a low density matrix. Second, the voltage applied to all of the remaining columns (nonaccessed columns) is maintained absolutely constant. The prevention of write and read disturb places severe restraints on the design of prior art memories resulting in a loss of density and access speed.

In general the prior art static RAMs have low density and performance due to write and read disturb considerations. The prior art cells are not uniquely accessed. They are accessed by the row, which creates a susceptibility toward write and read disturb.

SUMMARY

It is therefore an object of this invention to provide a memory having uniquely addressed cells.

It is another object of this invention to provide a memory having a higher density and a lower operating power.

It is a further object of this invention to provide a faster memory.

It is a further object of this invention to provide a static memory with a faster read cycle.

It is a further object of this invention to provide a static memory in which the data-out of each cell is determined by the initial change in the read voltage.

It is a further object of this invention to provide a memory having an extremely small maintainance current without employing high impedance load devices.

It is a further object of this invention to provide a memory in which the maintainance current is provided by charge pumping.

It is a further object of this invention to provide a high density, low power memory which has improved immunity to external interference effects such as leakage, threshold lowering, punch through, ionizing particle radiation etc.

It is a further object of this invention to provide a regenerative static RAM which requires minimal internal stability.

It is a further object of this ivnetion to provide a memory array in which defective cells can be more effectively mode redundant.

BRIEF DESCRIPTION OF THE DRAWING

Further objects and advantages of the present invention and the operation of the high density, low power RAM will become apparent from the following drawing in which:

FIG. 7A is a schematic diagram of a row pumped double cell having a shared row access switch; and FIG. 7B is a layout diagram for the cell of FIG. 7A.

DETAILED DESCRIPTION

Figure 1:
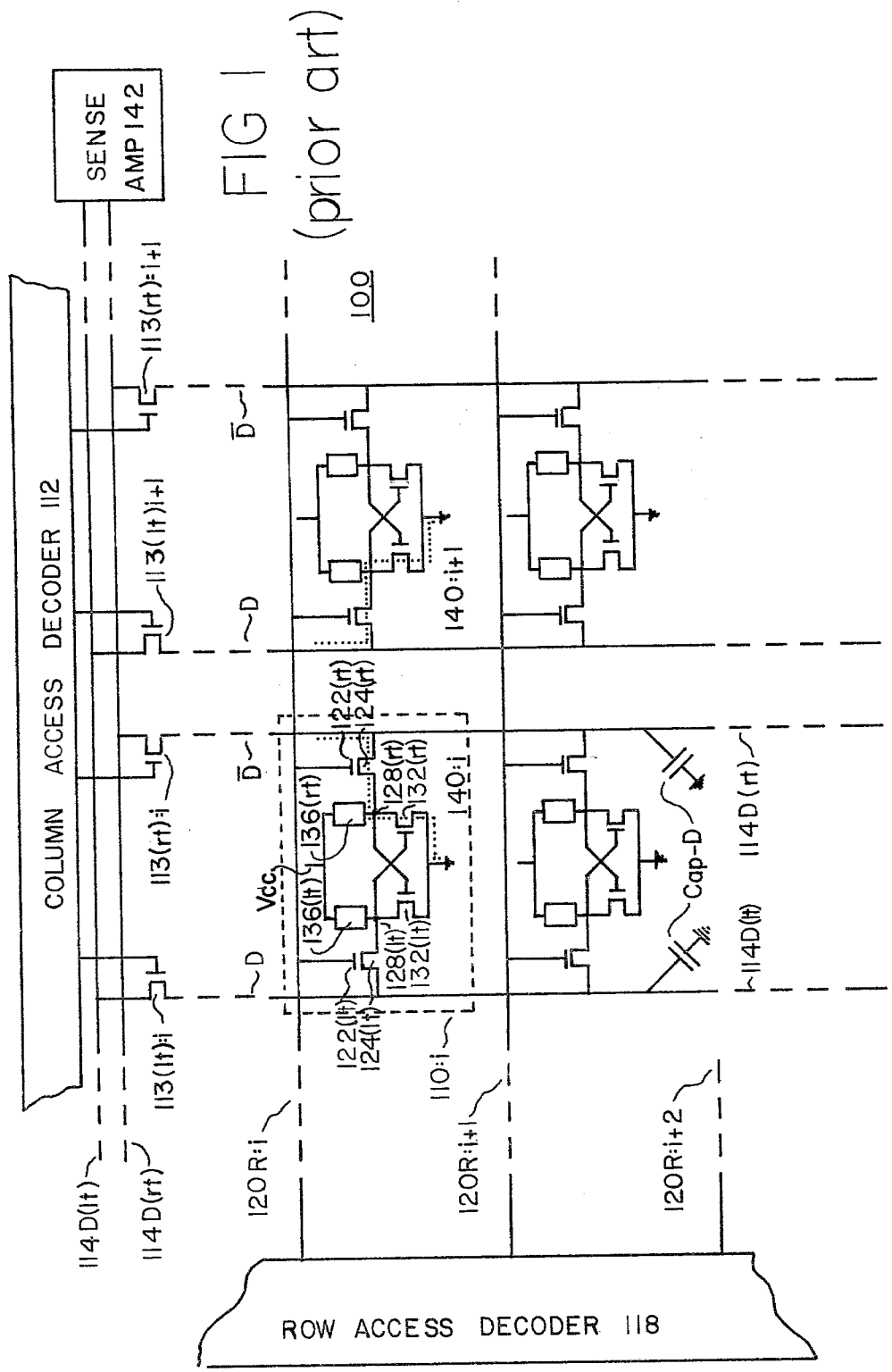
FIG. 1 is a schematic diagram of a prior art memory array showing multiple read currents.
Figure 2:
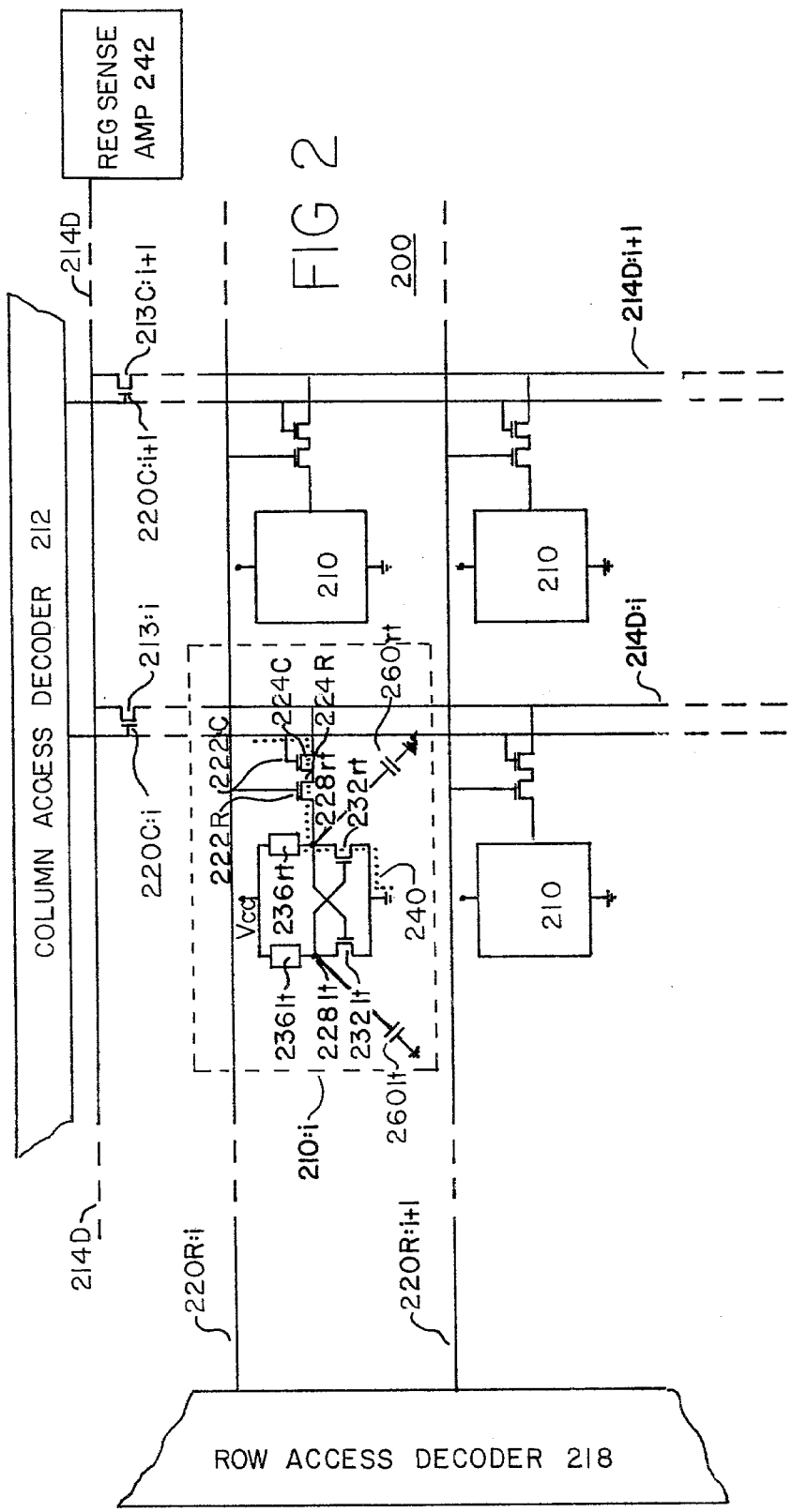
FIG. 2 is a schematic diagram of an embodiment of the present memory array showing row and column access switches in series for uniquely addressing each cell.

FIG. 2 shows a memory 200 with an array of regenerative bistable storage devices 210 each of which is uniquely addressed through a pair of series row and column access switches 224R and 224C connected to the cell node 228(rt). A four element regenerative bistable device is shown for comparison with the static prior art device of FIG. 1. Other types of regenerative bistable cells may be employed. Also, switching transistors 232 (shown as MOS devices) may be bipolar transistors with isolation provided during manufactering processing.

During write, a high access voltage from row decoder 218 is applied to row lead 220R:i and to gate 222R of each row switch 224R along the accessed row. Another high access voltage from column decoder 212 is applied to column lead 220C:i and to each gate 222C of each column switch 224C along the accessed column. The data-in (D high for "1" and low for "0") is applied to the single data line 214D and to the uniqiely addressed bistable device 210:i through column decoder transistor 213:i, driving device 210:i into the correct storage mode. Only the uniquely addressed cell 210:i at the intersection of the i-th row and i-th column has both an activated row gate 222R and an activated column gate 222C for receiving the data-in voltage. A high data-in voltage pulls node 228(rt) up, causing storage transistor 232(lt) to conduit and 232(rt) to turn off representing a stored "1". A low data-in voltage as shown applied to cell 210:i has the reverse effect, pulling node 228(rt) down and causing storage transistor 232(lt) to turn off and storage transistor 232(rt) to conduct representing a stored "0".

In N channel devices, a "1" is more difficult to write than a "0", because the high voltage on 214D forces conducting transistors 224 into the source follower mode. The current through node 228(rt) may not be sufficient to pull cell 210:i into the "1" state. The sizes or threshold voltages of the cell transistors may be selected which favor the establilshment of a stored "1". Alternatively, the access voltages to transistors 224 may be increased to speed up writing.

In order to read cell 210:i the high access voltages are again supplied to the i-th row and i-th column of memory 200. In addition, a read voltage is applied to the data-in lines 214D. Only the uniquely addressed cell 210:i has both access gates 222 activated. If addressed cell 210:i is in the "0" storage mode with storage transistor 232(rt) conducting as shown in FIG. 2, a low impedance read path is formed from data line 214D causing the read voltage on data line 214D to drop. A single sense amplifier 242, which senses the data lines 214D from each of the columns detects the lowered data line voltage and processes a "0" out of memory 200. If addressed cell 210:i is in the "1" storage mode, storage transistor 232(rt) is off preventing the low impedance loading of the data line voltage. The read voltage on data line 214D remains unchanged or is pulled higher by load element 236(rt), and sense amplifier 242 processes a "1" out of memory 200.

LOW READ CURRENT

The only cell of memory 200 which has a low impedance path for read current 240 during read is addressed cell 210:i at the intersection of the accessed row and the accessed column. All of the other cells on the accessed row and column have only either an activated row gate or an activated column gate, and the remaining cells in the memory on the non-accessed rows and columns have neither. The excessive multiple read current 140 characteristic of prior art memory 100, is avoided in the uniquely addressed memory 200. The read current 240 in a 16K embodiment (128 rows by 128 columns) is reduced from about 12.8 milliamps to about 100 microamps. The prior art cooling problems are avoided permitting larger bit size arrays.

The average load read current 240 for memory 200 is actually only 50 microamps because statistically only one half of the cells read will be in the "0" mode with storage transistor 232(rt) conducting read current. The other half will statistically be in the "1" mode without a read current loading the read voltage.

FAST READ CYCLE

The unique access of each cell 210 is memory 200 through the row and column access switches 222 permits the data-out to sense amplifier 242 to be easily rewritten by sense amplifer 242 back into the cell. During a single read cycle only node 228(rt) of addressed cell 210:i is exposed to the data line voltage to receive the rewrite data immediately after read. The "0" or "1"

storage state of addressed cell 210:i need not be preserved during read, because of the instant rewrite capability.

Sense amplifier 242 responds to the initial few tenths of a volt change on single data line 214D, as opposed to comparing the steady state voltage difference between twin data lines 114D(lt) and 114D(rt) of prior art memory 100. In this respect uniquely addressed memory 200 is similar to dynamic memories in which the stored data is rewritten as part of each read cycle. The actual reading of cell 210:i may therefore begin before the switching transients have settled. The row and column access voltage may be applied prior to the complete charging of the data line capacitance Cap-D. After the sense amplifier has detected the initial voltage change on the data line, the addressed cell may be flipped by any subsequent transient effect, and will be immediately returned to the correct original state by the regenerative capability of sense amplifier 242. Advancing the actual reading of the stored data into the transient portion of the read cycle results in a shorter read cycle time. At faster read cycles, the capcitance of row and column access leads 220 (Cap-R and Cap-C) become more significant as a delaying factor. The size of these parasitic capacitances may be minimized by layout considerations such as reversing the positions of leads 220. The delay caused by Cap-R and Cap-C may be minimized by applying the row and column voltages simultaneously with (or even prior to) the application of data line read voltage. Advancing the access voltage also advances the point in time when the addressed row and column switches 224R:i and 224C:i become activated permitting the flow of data therethrough.

CELL STABILITY

The unique address and regenerative rewrite capablility permit the addressed cell to flip on read, allowing a much lower stability standard in the cell design. In addition, the unique cell address avoids the write and read disturb problems associated with low stability cells, because only the addressed cell is completely exposed to the changing voltage on the data line caused by writing and reading. The partially accessed (but not addressed) cells in the remainder of the accessed i-th row and accessed i-th column have only one access gate activated. The unaccessed gate in each of these partially accessed cells remains unactivated and forms a barrier preventing the data line voltage and transients thereof from disturbing the storage state within the partially accessed cells. The cells unconnected to both the accessed row and the accessed column are not even partially accessed, and have both the row gate and column gate unactivated forming a double barrier against read disturb. All of the cells of memory 200 may have a low stability design and still function reliably.

The low stability standard of uniquely addressed memory 200 supports heretofore unpermitted freedom in cell design. For example, the maintainance current within memory 200 may be minimal, even as low as 100 nanoamps without exhibiting read disturb malfunction. The potential increase in cell density support an even faster read cycle due to reduced access lines and associated RC delays.

The regenerative aspect of sense amplifier 242 permits write and read disturb, and requires only that cells 210 maintain stability when not being accessed. The prior art cells 110 have a continuous high stability requirement because access disturb must be avoided. The removal of the stability design constraints permits new cells 210 to have a low stability-fast response design. For example, prior art cells 110 required long channel, high impedance access transistors for preventing read disturb; while present cell 210 may employ short channel, low impedance access transistors which permit a much faster sensing of data-in. Low stability and access disturb are permitted in the present cell 210 because of the unique accessing feature, which simplifies rewriting the data-out. The prior art cells 110 are not uniquely accessed. Each prior art cell along the selected row is simultaneously accessed to a data line, making rewriting impossible without the provision of a regenerative sense amplifier for each column. Access disturb must be prevented in the prior art array because of the lack of a rewrite capability.

LAMBDA TYPE BISTABLE CELL

Figure 3:
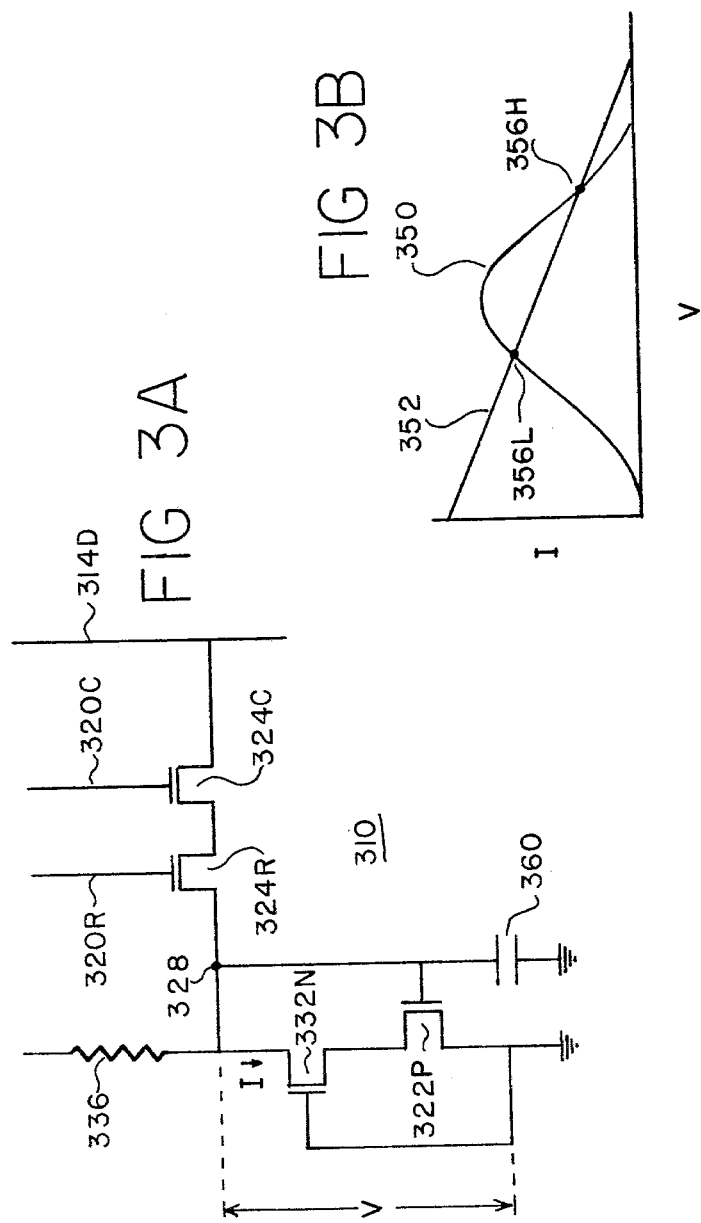
FIG. 3A is a schematic diagram of a lambda type bistable cell with unique addressing and regenerative capability.
FIG. 3B is a current-voltage curve of the lambda device of FIG. 3A.

Many types of memory cells may employ the unique access circuitry. FIG. 3 shows an example of a lambda type cell 310 in a unique access, regenerative application. The bistable element of cell 310 is a negative resistance lambda device formed by load element 336 (preferrably a constant current device providing one microamp or less at Vcc=5) in series with depletion NMOS transistor 332N and depletion PMOS transistor 332P. Transistors 332 are in cross gate relationship causing the current therethrough (from node 328 to ground) to peak (see FIG. 3B, characteristic curve 350). The current drops off as the voltage at node 328 increases, due to pinch off within transistor 332P. The bistable nature of Lambda device 310 is illustrated by the load line 352 which shows a low voltage stable state 356L in the ascending portion of characteristic curve 350, and a high voltage stable state 356H in the descending portion of characteristic curve 350. The stability of device 310 can be enhanced by a large storage capacitor 360 between node 328 and ground.

Use of the lambda device 310 in prior art, non-unique access memories resulted in extensive flipping because of the limited drive capability of lambda cell 310. The flipping tendency of cell 310 required a slow read cycle. The use of two series access gates 324R and 324C, plus a regenerative sense amplifier, overcomes the disadvantage of low stability memory cells as discussed hereinbefore.

FURTHER DENSITY REDUCTIONS

Figure 4:
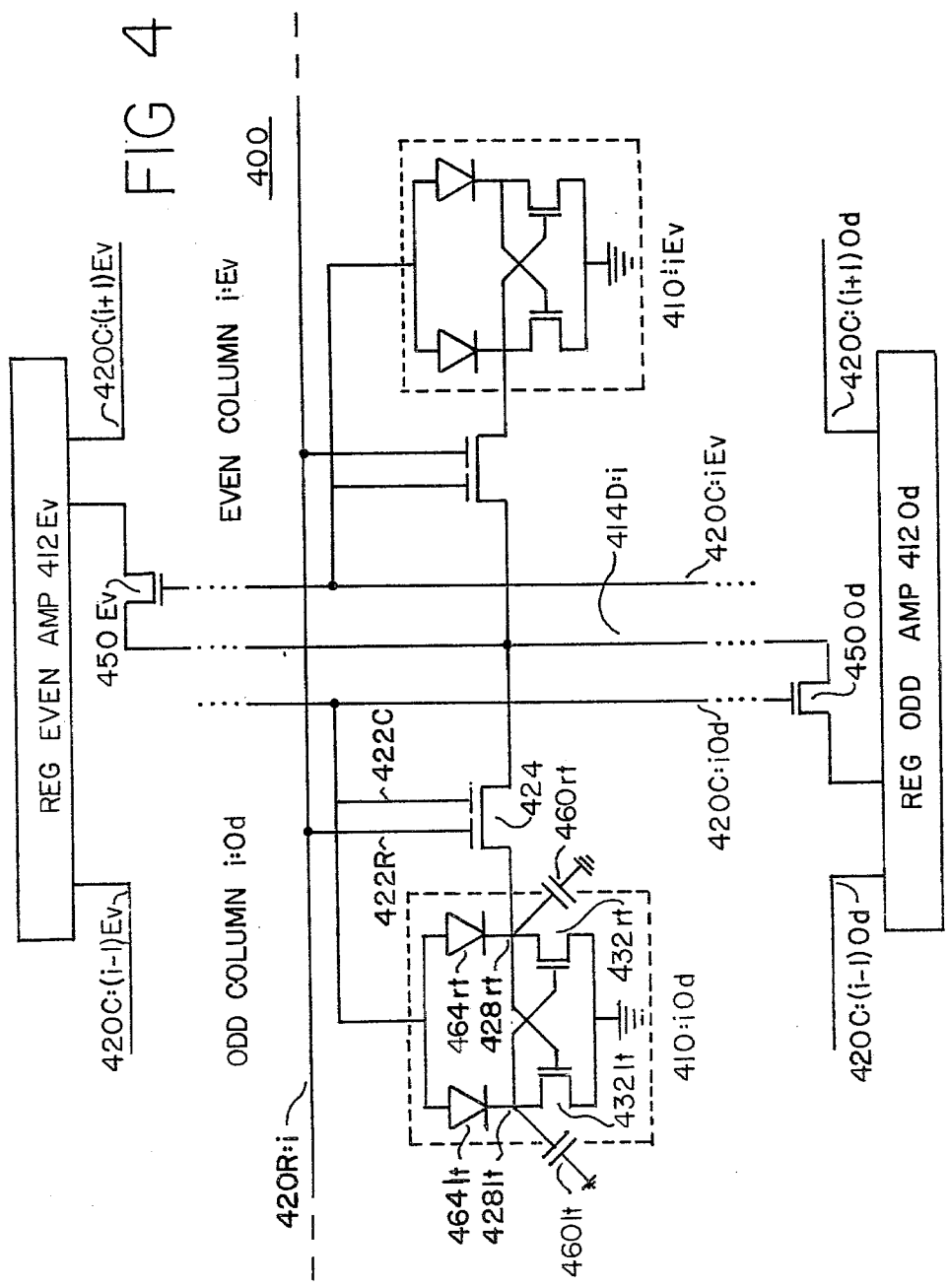
FIG. 4 is a schematic diagram showing a common data line embodiment with charge pumped node capacitors.

The data line may be shared between adjacent columns to reduce the long bus leads to 1 per row and 1.5 per column as shown in FIG. 4. The fundamental memory unit of the shared data line embodiment is two adjacent cells, one from an odd column and one from the neighboring even column. FIG. 4 shows the i-th row portion of the i-th double column formed by odd cells 410:iOd on one side of shared data line 414D and even cells 410:iEv on the other side. A pair of odd-even switches 450:Od and 450:Ev are provided in each column for directing common data line 414D to either odd common amplifier 412:Od or even common amplifier 412:Ev. Odd switch 450:Od is activated by column lead 420C:Od during column accessing of cell 410:iOd. Only one odd-even switch is activated at a time. The remaining odd-even switches are off and isolate the data line capacitance Cap-D of the non-accessed columns from accessed column "i-odd" for reducing reading transients. The pitch requirements of the peripheral circuitry can be eased by placing odd circuit elements along the bottom of array 400 and placing even circuit elements along the top of array 400 as shown in FIG. 4.

Figure 5:
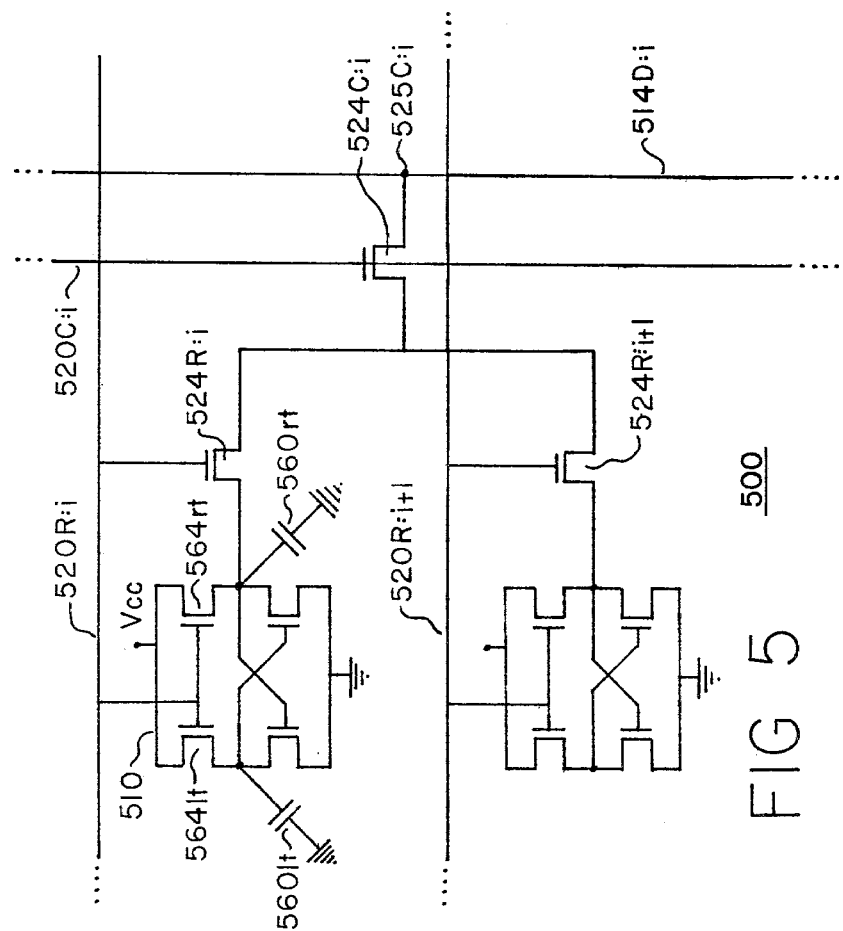
FIG. 5 is a schematic diagram showing a common column access switch and row pumped noded capacitance.

FIG. 5 shows a portion of the i-th column having a shared column transistor. Each column of the FIG. 5 embodiment has a single column access switch 524C which connects to each individual row transistor (524R:i, 524R:i plus 1 etc.), instead of having an individual column transistor for each cell. An alternative embodiment having a shared row transistor may also be implemented as shown in FIG. 7A.

CHARGE PUMPING

The uniquely addressed memory cells 210, 410, 510 and 710 have a greatly reduced power dissipation in the standby (non-accessed) mode by maintaining the stable states therein via the charge stored on capacitances 260, 460, 560 and 760 from nodes 228, 428, 528 and 728 to ground. The static memory cell of the present invention is preferrably recharged every 2–4 milliseconds (less often at low temperatures) the same as prior art dynamic memories. The bistable memories remain stable during the time between refresh pulses, losing only a fraction of the stored node charge. Surface and substrate generated leakage current is negligible, and does not significantly affect the magnitude of the charge available between refresh pulses. The refresh pulse reinforces the storage state of each memory cell and tops off the node capacitance charge. Node capacitors 260(lt) and 260(rt) may consist of the junction capacitors and the gate capacitance of storage transistors 232(lt) and 232(rt). The power required to charge the present memory cell for 100 nanoseconds each millisecond is about one nanowatt, reduced from 1–10 micro watts required by the continuously powered prior art memory cells. The power saving is due to the absence of dc power consumption during the standby mode, when no external voltages are applied to the present cell. The slow current drain from the node capacitance for maintaining the memory state and the leakage loss are negligible, even at 125 degrees centigrade. The power dissipated by a 16K memory of present cells is less than 0.1 milliwatt, as compared to 10–50 milliwatts required by a prior art 16K memory.

The absence of continuous power dissipation raises the problem of supplying power to the cells during write and read. The small amount of power stored in the node capacitance is insufficient to maintain the cell when addressed, and the stored data would be lost. Simultaneous power-up and accessing is ensured by the circuit of FIGS. 4 (and 5 and 7) in which the Vcc voltage is applied to diodes 464 (and transistors 564 and 764) from column access lead 420C (and row access lead 520R and 720R). Each cell on the accessed column (or row) is automatically powered up and prepared for writing or reading without data loss. Diodes 464 are designed with a relatively high forward impedance so that the diode 464-transistor 432 inverter formed in each branch will have two distinct voltage levels, one corresponding to each stable state. The access leads may be employed to supply Vcc power to the addressed cell through either the accessed column or the accessed row (but not both) because the other access line to the partially addressed cells is off. None of the remaining powered up cells are exposed to the data-in transients, and the problem of flipping does not arise. Increasing the stored charge of the present charge pumped memory cell increases the cells stability. Larger node capacitances with a more abrupt pn junction can be produced by increasing the substrate doping at the node location, with for example, high energy implant through the buried contact mask opening.

The refresh clock may be positioned on the same chip as the memory array, and the refresh rate may be made temperature dependent. As the temperature increases, the refresh rate increases a corresponding amount to compensate for increased junction leakage.

An increased refresh rate may be employed to reduce alpha particle induced soft errors. Alpha particle interference may be further reduced by using an epitaxial substrate or diffused P wells. During power-up, the cells are completely immune to incident alpha particles because of the relatively low impedance of load diodes 464 and load transistors 564 and 764.

Figure 6:
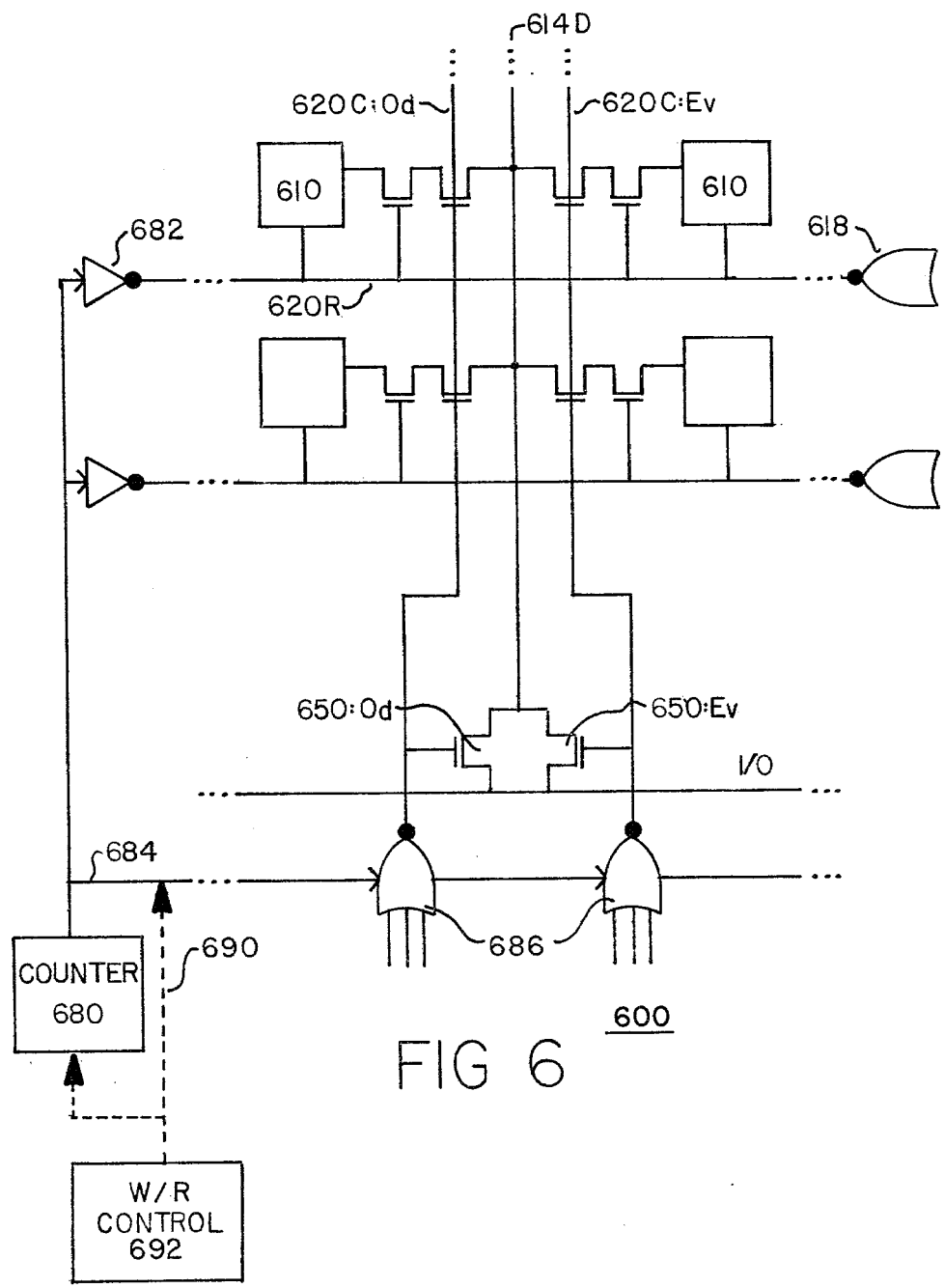
FIG. 6 is a schematic diagram of a memory array with a counter for providing periodic, automatic charge pumping simultaneously to all rows in the array of FIG. 5.

FIG. 6 shows an array of row charged pumped memory cells 610 and peripheral circuitry. On-chip-counter 680 provides a single refresh pulse simultaneously to every row of the array through buffers 682. Unlike dynamic memories, the refresh of the present charge pumped memories does not involve the regenerative capability of the sense amplifier. The refresh cycle of the present memory is therefore not limited to a single row at a time. However, the present memories could be refreshed by rows or sequentially by blocks to reduce the current transients requirements placed on the counter.

The coincidence of refresh with reading or writing is prevented by disable line 684 which disables the column decoder 686 during refresh. The disable period is about 0.1% of the memory duty cycle, as opposed to much higher disable periods in prior art dynamic memories. Off chip refresh, or refresh control may be provided for large systems requiring syncronization of data paths. The 1 millisecond interval between refresh pulses can be used for multiple read/write operations at any location because each accessed cell is independently powered through one of the access leads.

The prevention of refresh and read/write may also be avoided by disabling counter 680 through lead 690 (shown in dash) from read/write controller 692. The disable signal resets free running counter 680. The refresh cycle is automatically initiated at the end of the read/write operation by the falling edge of the read/write signal. All of the rows are refreshed including the one that has just been accessed, adding 50–100 nano seconds to the read/write cycle period. The refresh cycle is entirely transparent to the user.

SPECIFIC LAYOUT

FIG. 7A shows a charged pumped double cell 710 having a shared row switch 724R between odd cell 710:Od and 710:Ev. FIG. 7B shows a layout of cell 710, employing two levels of polysilicon. The first level includes load transistors 764(lt) and 764(rt), shared row switch 724R, and one of the storage transistors 763(rt). The second level of polysilicon (or another inter-connect material) is isolated from the first level and forms column access transistor 724C:Ev (the column access line) and the second storage transistor 763(lt).

Both layers of polysilicon are in direct contact with diffusions at nodes 728(lt) and 728(rt). Each cell shares a Vcc, Vss, and output node with four adjacent cells. Each cell therefore requires only a ¾ contact, in contrast to the prior art which typically required 2–3 contacts per cell. In addition, each pair of adjacent cells shares metal leads for data-in, Vss, and Vcc; and require only 1 and ½ metal leads per cell, in contrast to the prior art which typically required 2–3 lines per cell. As a result, the top interconnect layer (preferrably of aluminum) may be patterned with wide lines and spaces for effecting maximum continuity and minimum bridging between adjacent lines. Each cell within double cell 710 occupies a square area of 480 square microns (0.75 square mils), yet has a 12 micron aluminum pitch. The most dense prior art cells had a nine micron pitch for a cell area of approximately 1.3 square mils.

CONCLUSION

It will be apparent to those skilled in the art that the objects of this invention have been achieved by providing a regenerative, uniquely addressed memory.

Clearly various changes may be made in the structure and embodiments shown herein without departing from the concept of the invention. Further, the features of each embodiment shown in the various Figures may be employed with the embodiments of the other Figures.

Therefore, the scope of the invention is to be determined by the terminology of the following claims and the legal equivalents thereof.

I claim as my invention:

1. A regenerative memory device for writing data-in and reading data-out, the memory device comprising:
    an array of memory cells arranged in a row by column matrix;
    a set of row access leads extending across the matrix in the row direction;
    a set of column access leads extending across the matrix in the column direction;
    access controller means for selectively activating a row access lead and a column access lead to address any individual memory cell;
    a single data lead means for the conduction of data-in and data-out, said single data lead means extending to each memory cell;
    write means for providing data-in to the addressed memory cell through said single data lead means during write;
    regenerative read means for receiving data-out from and refreshing data-out back into the accessed memory cell through said single data lead means during read;
    at least one bistable storage means within each of the memory cells of the array having a first stable state representing one binary number and having a second stable state representing the other binary number;
    a single input-output node within each memory cell of the array for receiving data-in during write and for providing data-out during read;
    access switch means within each memory cell of the array connected in series between said single input-output node of said memory cell and said single data lead means and responsive to the activated row access lead and the activated column access lead by the access controller means for permitting the data-in and data-out to pass between said single input-output node and said single data lead means.

2. The regenerative memory of claim 1, further characterized in that the access switch means within the array comprises:
    a row switch for each cell, said row switch being connected in series between said single input-output node and said single data lead means, the row switches along each row being responsive to the signal on the row access lead for that row conducting data between each cell and the data lead means; and
    a column switch for each cell, said column switch being connected in series between said single input-output node and the row switch for that cell and said single data lead means, the column switches along each column being responsive to the signal on the column access lead for that column for conducting data between each cell and the data lead means;
    whereby data passes between each cell and the data lead means only when both the row switch and the column switch thereof are conductive.

3. The regenerative memory of claim 2, wherein the access switch means for each memory cell is a single transistor having a row gate responsive to the activation of the row access lead and a column gate responsive to the activation of the column access lead.

4. The regenerative memory of claim 1, wherein the access switch means within the memory array is a set of transistors for each row and a single transistor for each column.

5. The regenerative memory of claim 1, wherein the access switch means within the memory array is a set of transistors for each column and a single transistor for each row.

6. The regenerative memory of claim 1, wherein:
    an individual row access lead extends along each row of the array;
    an individual column access lead extends along each column of the array; and
    the data lead means is a set of individual leads, one individal lead extending along each of the columns.

7. The regenerative memory of claim 1, wherein:
    said single data lead means comprises a set of shared data leads extending in the column direction, one shared data lead extending to each odd-even pair of adjacent columns for sharing therebetween;
    odd-even switch means for each individual shared data lead responsive to the activation of the column access lead for connecting the read means to the accessed one of the odd-even pair of columns; and
    the read means has an odd portion for receiving data-out from an addressed cell in the odd column and an even portion for receiving data-out from an addressed cell in the even column.

8. The regenerative memory of claim 1, wherein the at least one bistable storage means is a negative resistance device comprising:
    a load resistor having two leads, the first lead connected to a first voltage potential;
    a P-channel transistor having a source lead, a gate lead forming the capacitive storage node connected to the input/output node, and a drain lead connected to a second voltage potential; and
    an N-channel transistor having a drain lead connected to said source lead of said P-channel transistor, a source lead connected to the second lead of said load resistor and the input-output node, and a gate lead connected to said drain lead of said P-channel transistor.

9. The regenerative memory of claim 1, wherein the regenerative read means is responsive to the initial voltage transients on said single data lead means after the access switch means has connected the input-output node to said single data lead means for reading data-out.

10. The regenerative memory of claim 1, wherein the bistable storage means comprises:

a first branch formed by a first charge control means and a first transistor means connected in series with a node point therebetween;

a second branch connected in parallel with the first branch and formed by a second charge control means and a second transistor means connected in series with a node point therebetween;

the first transistor means in the first branch responsive to the voltage on the node point of the second branch for establishing the first stable state in which the first transistor means has a conducting status and the second transistor means has a non-conducting status, and the second transistor means in the second branch responsive to the voltage on the node point of the first branch for establishing the second stable state in which the second transistor means has a conducting status and the first transistor means has a non-conducting status; and capacitance means for providing the current flow through the conducting one of the transistor means for maintaining the conducting and non-conducting status of the transistor means.

11. The regenerative memory of claim 10, further comprising means for periodically charging the capacitance means by activating the charge control means for maintaining the conducting and non-conducting status of the transistor means.

12. The regenerative memory of claim 11, wherein the capacitacnce means is a first capacitor across the first transistor means and a second capacitor across the second transistor means.

13. The regenerative memory of claim 12, wherein the first capacitor is the node capacitance of the first node point, and the second capacitance is the node capacitance of the second node point.

14. The regenerative memory of claim 13, wherein:
the first charge control means is a first forward biased diode which permits the first node capacitance to receive charging current from the means for charging, but prevents the first node capacitance from discharging through the means for charging; and the second charge control means is a second forward biased diode which permits the second node capacitance to receive charging current from the means for charging, but prevents the second node capacitance from discharging through the means for charging.

15. The regenerative memory of claim 10, wherein: the first and second charge control means are transistors responsive to the activation of one of the access leads to that memory cell for permitting the first and second charge control means to receive charging current from the means for charging, but prevents the first and second charge control means from discharging through the means for charging when the access lead is not activated.

16. The regenerative memory of claim 15, wherein the first and second charge control transistors are responsive to the activation of the row access lead.

17. The regenerative memory of claim 15, wherein the first and second charge control transistors are responsive to the activation of the column access lead.

18. A regenerative static RAM for writing data-in and reading data-out, comprising:

a plurality of memory cells arranged in a row by column matrix;

access means for addressing a single cell of the matrix;

a single data lead means for the conduction of data-in and data-out, said single data lead means extending to each cell of the matrix;

write means for providing data-in to the addressed cell through said single data lead means;

regenerative read means for receiving data-out from the addressed cell through said single data lead means;

at least one capacitance discharge maintained bistable storage means within each of the plurality of the memory cells for storing the data-in;

a single input-output node between each bistable storage means and said single data lead means through which the data-in and data-out pass;

a row access switch and a column access switch for each memory cell connected in series between the input-output node and the data lead means, and responsive to the access means for controlling the passage of data-in and data-out; and refresh means for periodically recharging the bistable storage means.

19. The regenerative static RAM of claim 18, wherein the refresh means periodically disables the regenerative read means for recharging the bistable storage means.

20. The regenerative static RAM of claim 18, wherein the regenerative read means disables the refresh means for reading the data-out from the bistable storage means.

* * * * *